US012804869B2

(12) United States Patent
Fukuzawa et al.

(10) Patent No.: US 12,804,869 B2
(45) Date of Patent: Nov. 17, 2026

(54) ELECTRONIC CONTROL DEVICE

(71) Applicant: Hitachi Astemo, Ltd., Hitachinaka (JP)

(72) Inventors: Takayuki Fukuzawa, Hitachinaka (JP); Yoshio Kawai, Hitachinaka (JP); Akihiro Namba, Tokyo (JP); Ning Tang, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 118 days.

(21) Appl. No.: 18/700,980

(22) PCT Filed: Oct. 26, 2021

(86) PCT No.: PCT/JP2021/039500

§ 371 (c)(1),
(2) Date: Apr. 12, 2024

(87) PCT Pub. No.: WO2023/073809

PCT Pub. Date: May 4, 2023

(65) Prior Publication Data

US 2024/0414903 A1 Dec. 12, 2024

(51) Int. Cl.
*H05K 9/00* (2006.01)
*H05K 7/14* (2006.01)

(52) U.S. Cl.
CPC ......... *H05K 9/0081* (2013.01); *H05K 7/1427* (2013.01)

(58) Field of Classification Search
CPC .................................................... H05K 7/1427
See application file for complete search history.

(56) References Cited

U.S. PATENT DOCUMENTS

| | | | | |
|---|---|---|---|---|
| 6,451,374 B1 * | 9/2002 | Watchko | H05K 9/0015 | 427/284 |
| 2001/0052521 A1 * | 12/2001 | Goyal | H05K 5/15 | 220/4.21 |
| 2005/0045358 A1 * | 3/2005 | Arnold | H05K 9/003 | 174/51 |
| 2008/0266820 A1 * | 10/2008 | Jairazbhoy | H05K 9/0016 | 361/753 |
| 2012/0133072 A1 * | 5/2012 | Bunyan | C09D 5/34 | 264/261 |
| 2018/0255633 A1 * | 9/2018 | Nozawa | H05K 1/0216 | |
| 2022/0354011 A1 * | 11/2022 | Hadwan | H05K 5/069 | |
| 2023/0101552 A1 * | 3/2023 | Duralek | H05K 5/0052 | 174/377 |

FOREIGN PATENT DOCUMENTS

JP 2005-294627 A 10/2005

OTHER PUBLICATIONS

International Search Report and Written Opinion, with English translations, for PCT/JP2021/039500, dated Jan. 25, 2022, 9 pages.

* cited by examiner

*Primary Examiner* — Allen L Parker
*Assistant Examiner* — Peter Krim
(74) *Attorney, Agent, or Firm* — Foley & Lardner LLP

(57) ABSTRACT

An electronic control device includes: a substrate; a housing; and a shielding material that is filled between the substrate and the housing and electrically connects the substrate to the housing. In addition, in the shielding material, formed is a low-impedance region which has a low impedance and in which the density of a conductive filler is higher than in other portions.

12 Claims, 8 Drawing Sheets

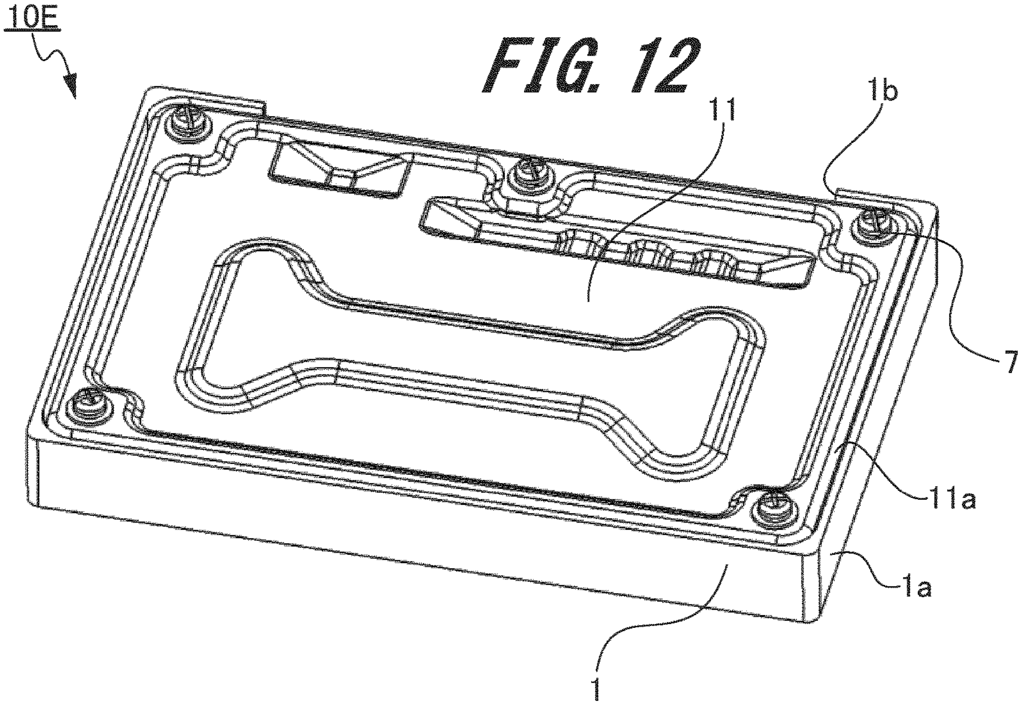
FIG. 12
FIG. 13
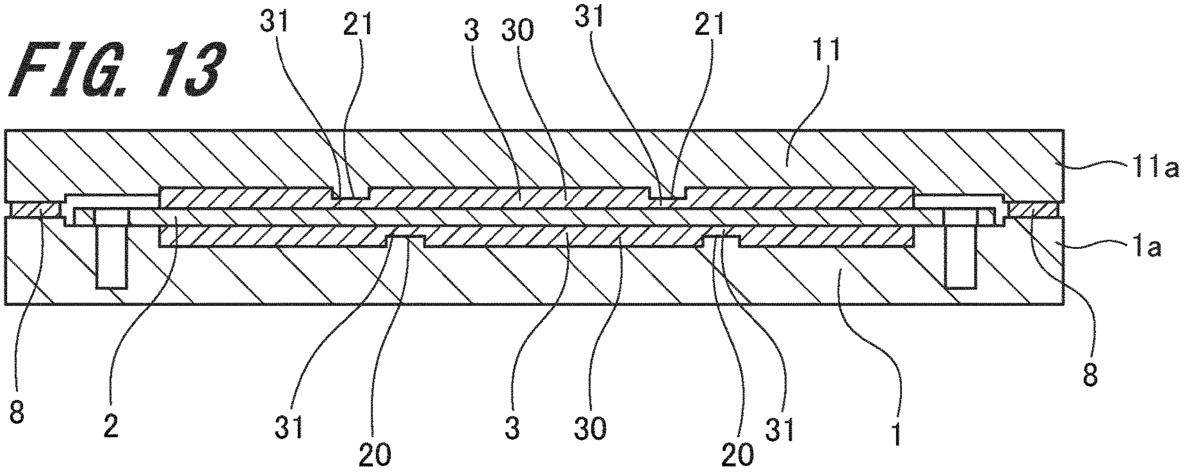

ELECTRONIC CONTROL DEVICE

TECHNICAL FIELD

The present invention relates to an electronic control device.

BACKGROUND ART

An electronic control device having an electronic component for controlling an automobile is disposed in the automobile. Furthermore, in recent years, demand for advanced driving assistance systems (hereinafter, referred to as ADAS) and automatic driving (hereinafter, referred to as AD) systems has increased, and development of automatic driving technology of automobiles has accelerated. An electronic component such as a CPU having a high operation frequency mounted on an electronic control device for the ADAS or the AD is one of generation sources of electromagnetic radiation.

As a technology for preventing leakage of the emitted electromagnetic radiation to the outside, for example, there is a technology as described in Patent Literature 1. Patent Literature 1 describes that a plurality of connection portions connecting a housing and a front surface and a back surface of a wiring substrate are provided, and the wiring substrate is sandwiched between the connection portions.

CITATION LIST

Patent Literature

Patent Literature 1: JP 2005-294627 A

SUMMARY OF INVENTION

Technical Problem

However, more excellent processing speed and communication speed are required for the electronic component mounted on the electronic control device for the ADAS or the AD, and the electromagnetic radiation emitted from the electronic component further increases. In addition, the technology described in Patent Literature 1 has a problem that it is not possible to sufficiently reduce leakage of increasing electromagnetic radiation to the outside.

In view of the above problems, an object of the present invention is to provide an electronic control device capable of reducing leakage of electromagnetic radiation to the outside of a housing.

Solution to Problem

In order to solve the above problem and achieve the object, an electronic control device includes a substrate on which an electronic component is mounted, a housing that houses the substrate, and a shielding material that is filled between the substrate and the housing, has a conductive filler, and electrically connects the substrate and the housing. In addition, in the shielding material, formed is a low-impedance region which has a low impedance and in which the density of a conductive filler is locally higher than in other portions.

Advantageous Effects of Invention

According to the electronic control device having the above configuration, it is possible to reduce leakage of electromagnetic radiation to the outside of the housing.

BRIEF DESCRIPTION OF DRAWINGS

FIG. 12 is a perspective view illustrating an electronic control device according to a sixth exemplary embodiment.

FIG. 13 is a cross-sectional view illustrating the electronic control device according to the sixth exemplary embodiment.

DESCRIPTION OF EMBODIMENTS

Figure 1:
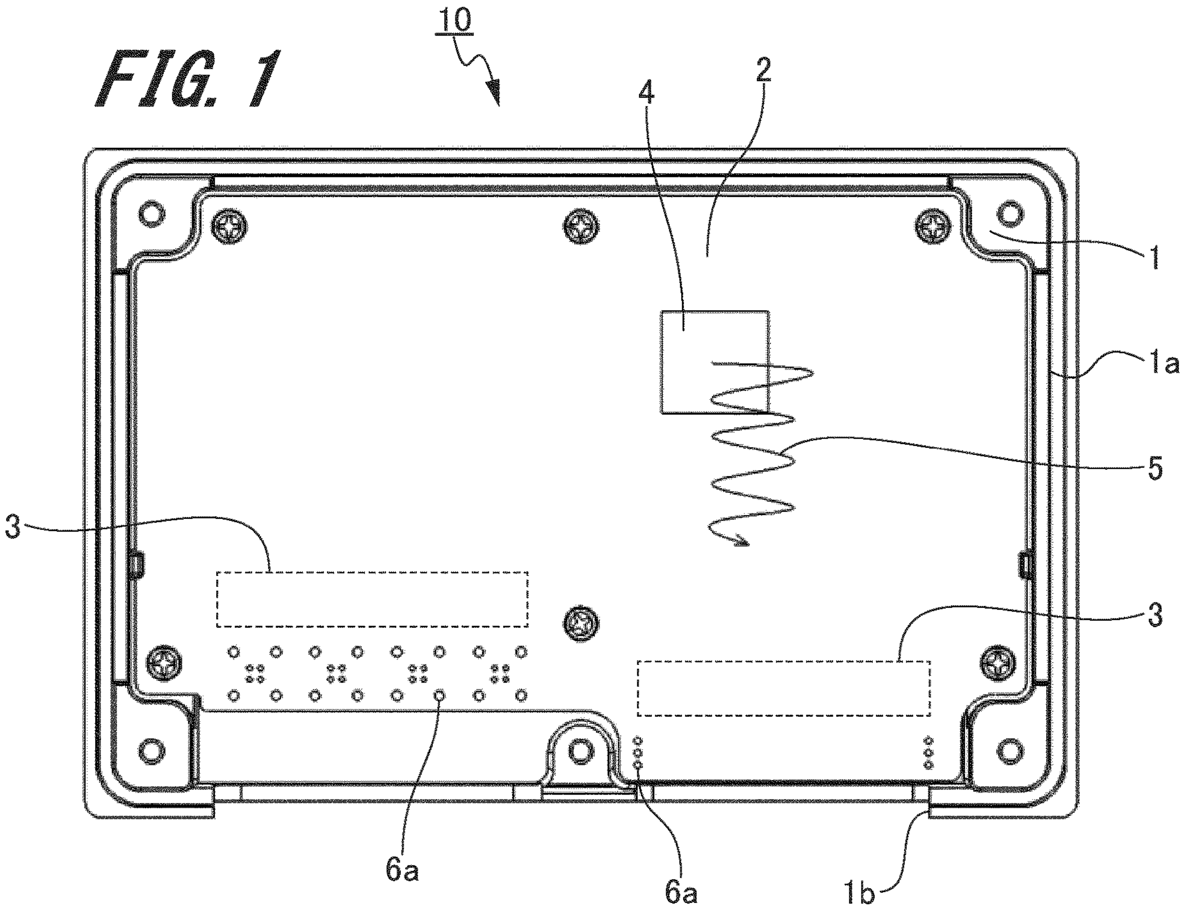
FIG. 1 is a plan view illustrating an electronic control device according to a first exemplary embodiment.

Hereinafter, exemplary embodiments of the electronic control device will be described with reference to FIGS. 1 to 13. In the drawings, the same members are denoted by the same reference numerals.

1. First Exemplary Embodiment

First, a configuration of an electronic control device according to a first exemplary embodiment (hereinafter, referred to as "present embodiment") will be described with reference to FIGS. 1 to 4.

Figure 2:
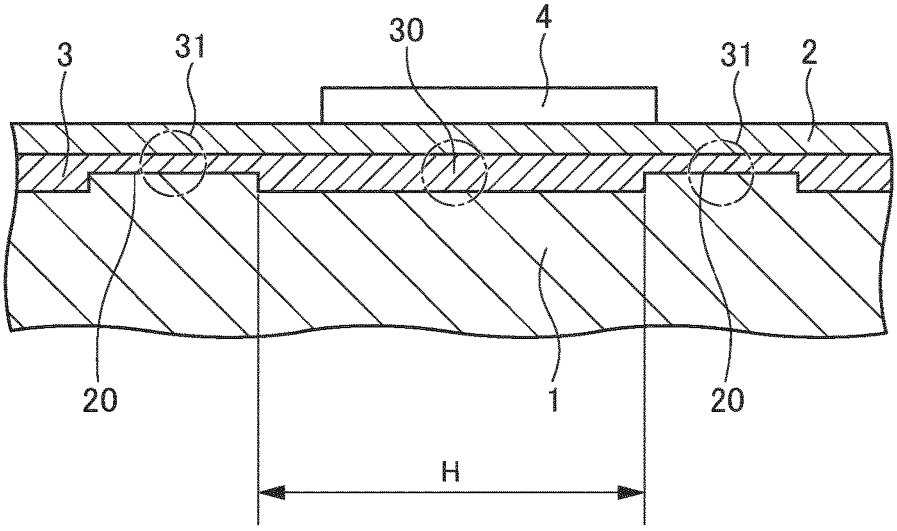
FIG. 2 is a cross-sectional view of the electronic control device according to the first exemplary embodiment.

FIG. 1 is a plan view illustrating the electronic control device, and FIG. 2 is a cross-sectional view illustrating the electronic control device.

The device illustrated in FIG. 1 is an electronic control device mounted on an automobile and having an electronic circuit that controls the automobile. As illustrated in FIG. 1, the electronic control device 10 includes a base 1 constituting a housing, a substrate 2 on which an electronic component 4 such as a semiconductor component is mounted, and a shielding material 3. The substrate 2 is housed in the base 1.

The base 1 indicating a first housing is formed in a container shape with one surface opened. The base 1 has side surface portions 1*a* surrounding one opened surface. Furthermore, an opening portion 1*b* is formed in one of the four side surface portions 1*a* of the base 1. Furthermore, the base 1 is formed of a metal member. A mounting portion 6*a* on which a connector 6 (see FIG. 8) is mounted is provided at a portion facing the opening portion 1*b* formed in the base 1 in the substrate 2. In addition, the opening portion 1*b* of the base 1 faces the connector 6 (see FIG. 8) mounted on the substrate 2.

As illustrated in FIG. 2, the shielding material 3 is filled between the base 1 and the substrate 2. Referring back to FIG. 1, the shielding material 3 is disposed at least in the vicinity of the mounting portion 6*a* in the substrate 2, that is, at a position facing the opening portion 1*b* of the base 1. In addition, the shielding material 3 electrically connects the base 1 and the substrate 2. Note that the coating heights of the shielding material 3 according to the first exemplary embodiment are all set to a uniform height.

Furthermore, as illustrated in FIG. 2, a plurality of protrusions 20 is formed at a portion of the base 1 where the shielding material 3 is provided. The protrusions 20 protrude from one surface of the base 1 facing the substrate 2 toward the substrate 2. In addition, the protrusions 20 press the shielding material 3 provided between the substrate 2 and the base 1. As a result, a high compression region 31 pressed by the protrusion 20 and a low compression region 30 not pressed by the protrusion 20 are formed in the shielding material 3.

Figure 3:
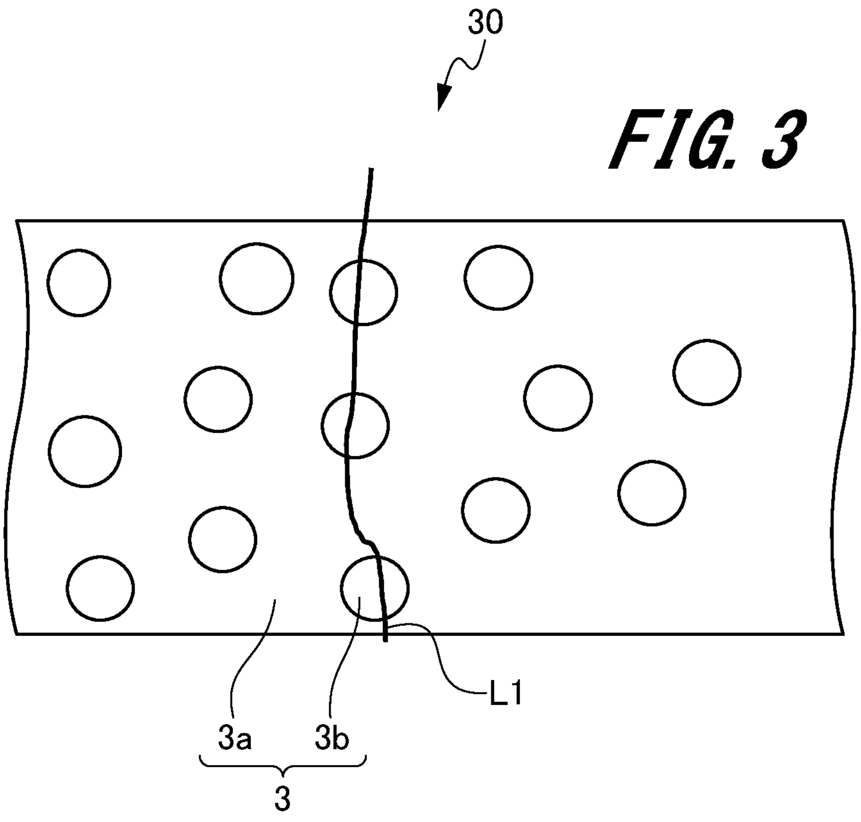
FIG. 3 is a schematic view illustrating a low compression region of the electronic control device according to the first exemplary embodiment.
Figure 4:
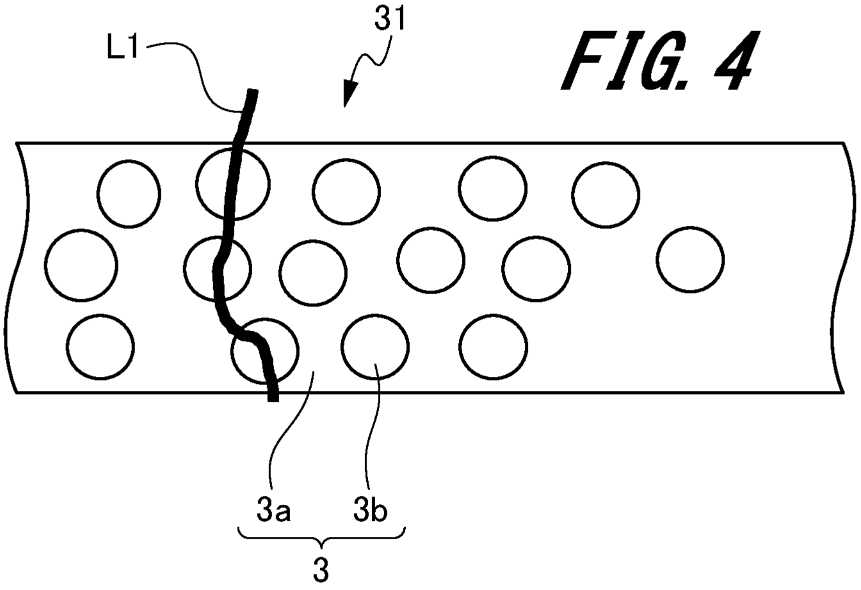
FIG. 4 is a schematic view illustrating a high compression region of the electronic control device according to the first exemplary embodiment.

FIG. 3 is a schematic view illustrating the low compression region 30 of the shielding material 3, and FIG. 4 is a schematic view illustrating the high compression region 31 of the shielding material 3.

As illustrated in FIGS. 3 and 4, the shielding material 3 includes a base material 3*a* and conductive fillers 3*b* contained in the base material 3*a*. The density of the conductive fillers 3*b* in the high compression region 31 is higher than the density of the conductive fillers 3*b* in the low compression region 30. Therefore, the distance between the conductive fillers 3*b* in the high compression region 31 is smaller than the distance between the conductive fillers 3*b* in the low compression region 30. As a result, a conductive path L1 formed by connecting the conductive fillers 3*b* in the high compression region 31 is better than the conductive path L1 in the low compression region 30. As a result, the impedance of the high compression region 31 becomes lower than the impedance of the low compression region 30. Therefore, in the shielding material 3, a low impedance region (high compression region 31) where the impedance locally decreases and a normal impedance region (low compression region 30) are formed.

As described above, by providing the low impedance region (high compression region 31) where the impedance locally decreases, it is possible to reduce leakage of electromagnetic radiation 5 emitted from the electronic component 4 to the outside of the housing of the electronic control device 10. Furthermore, as described above, since the shielding material 3 is provided at least in the opening portion 1*b* of the base 1, it is possible to reduce leakage of the electromagnetic radiation 5 to the outside through the opening portion 1*b* of the base 1.

As a form of the shielding material 3, a form-in-place gasket (hereinafter, referred to as FIPG) for bonding both surfaces of the base 1 and the substrate 2, a cured-in-place gasket (hereinafter, referred to as CIPG) for bonding only one surface, and the like can be considered. For the material of a base as the base material 3*a*, various materials such as silicon, epoxy, acrylic, and the like can be selected depending on the mounting environment. In addition, as the conductive filler 3*b*, various materials such as silver, copper, aluminum, nickel, graphite, and the like can be selected. Furthermore, the conductive filler 3*b* may be subjected to a surface treatment such as nickel plating, copper plating, or the like.

Furthermore, by providing the plurality of protrusions 20, the high compression region 31 can be provided at a plurality of portions. In addition, the interval between the two adjacent protrusions 20 and 20 in the plurality of protrusions 20, that is, an interval H between the high compression regions 31 is set to be less than or equal to a half of the wavelength of the electromagnetic radiation 5 desired to be particularly suppressed. As a result, the effect of reducing the electromagnetic radiation 5 can be improved. For example, when electromagnetic radiation of 1.4 GHz is particularly suppressed, the interval H between the high compression regions 31, that is, the interval between the protrusions 20 is set to 107 mm or less, which is a half wavelength of 1.4 GHZ.

2. Second Exemplary Embodiment

Next, an electronic control device according to a second exemplary embodiment will be described with reference to FIGS. 5 and 6.

Figure 5:
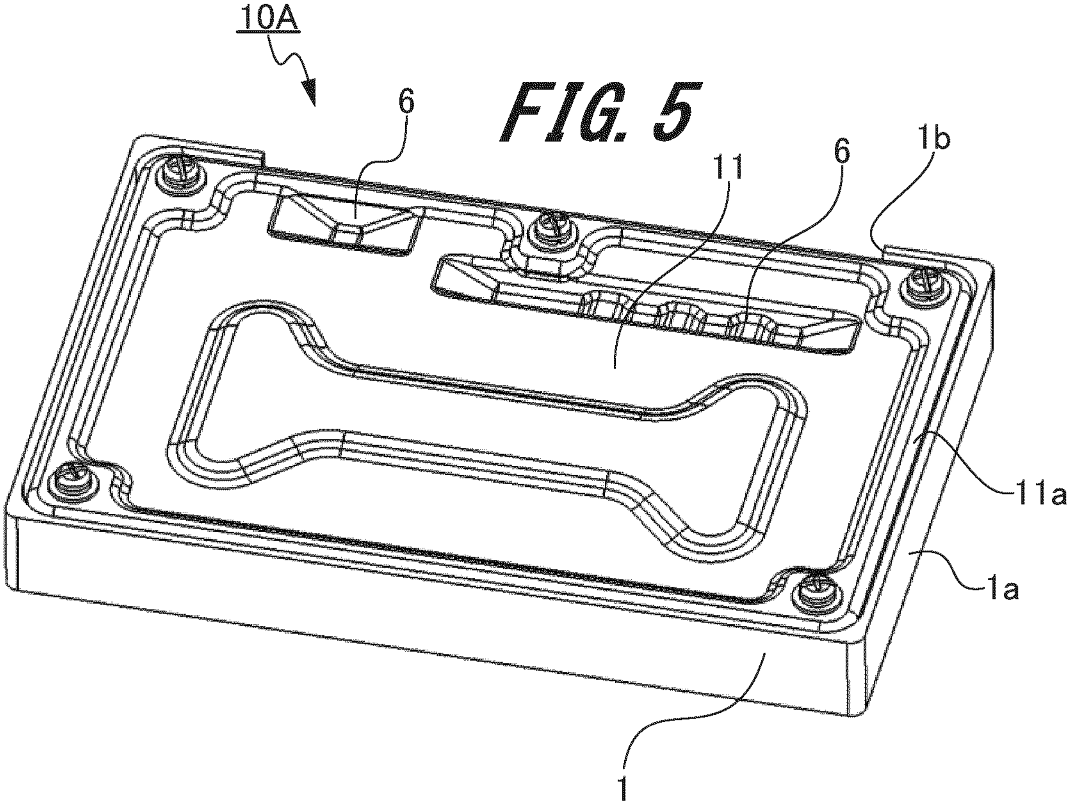
FIG. 5 is a perspective view illustrating an electronic control device according to a second exemplary embodiment.
Figure 6:
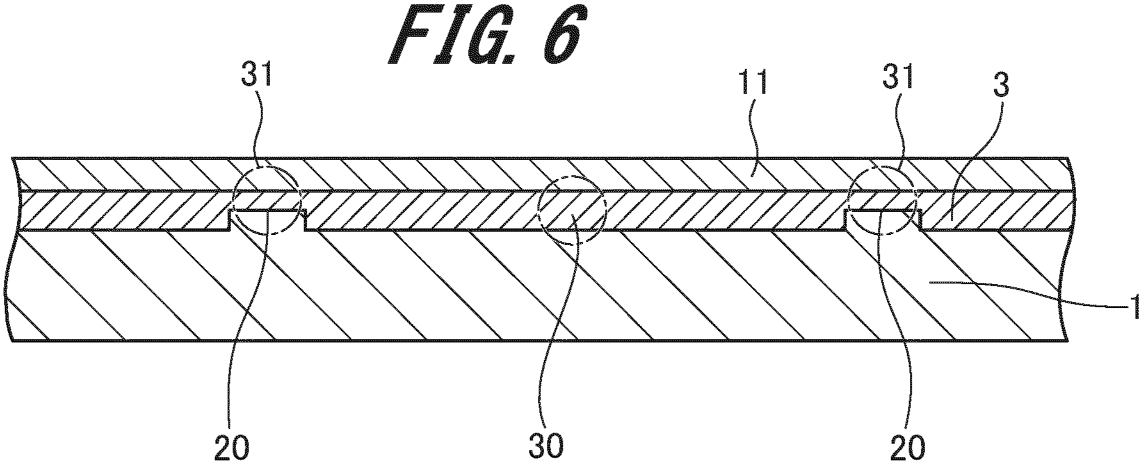
FIG. 6 is a cross-sectional view illustrating the electronic control device according to the second exemplary embodiment.

FIG. 5 is a perspective view and FIG. 6 is a cross-sectional view illustrating the electronic control device. Note that a part common to the electronic control device 10 according to the first exemplary embodiment is denoted by one reference numeral, and redundant description will be omitted.

As illustrated in FIG. 5, an electronic control device 10A includes a cover 11 that closes an upper opening of the base 1 indicating the first housing. The base 1 and the cover 11 constitute a housing of the electronic control device 10A. The cover 11 indicating a second housing is formed in a substantially flat plate shape having a rectangular shape. Similarly to the base 1, the cover 11 is made of a metal member.

The side surface portion 1*a* of the base 1 and an edge portion 11*a* of the cover 11 overlap each other. In addition, as illustrated in FIG. 6, a portion where the base 1 and the cover 11 overlap each other is filled with the shielding material 3. As a result, the gap generated between the base 1 and the cover 11 can be closed by the shielding material 3. A surface of the base 1 facing the cover 11 is provided with a plurality of protrusions 20. The protrusions 20 protrude from the surface of the base 1 toward the cover 11. In addition, the protrusions 20 press the shielding material 3. As a result, a high compression region 31 pressed by the protrusion 20 and a low compression region 30 not pressed by the protrusion 20 are formed in the shielding material 3.

Also in the electronic control device 10A according to the second exemplary embodiment, it is possible to provide a low impedance region (high compression region 31) where the impedance locally decreases and a normal impedance region (low compression region 30). As a result, it is possible to reduce leakage of the electromagnetic radiation 5 emitted from the electronic component 4 to the outside of the housing of the electronic control device 10A. Furthermore, according to the electronic control device 10A according to the second exemplary embodiment, it is possible to reduce leakage of the electromagnetic radiation 5 to the outside from not only the opening portion 1*b* facing the connector 6 in the housing but also the gap generated between the base 1 and the cover 11.

Since other configurations are similar to those of the electronic control device 10 according to the first embodiment, the description thereof will be omitted. The electronic control device 10A having such a configuration can also obtain the same operation and effect as those of the electronic control device 10 according to the first exemplary embodiment described above.

Note that, in the electronic control device 10A according to the second exemplary embodiment, an example in which the protrusions 20 that press the shielding material 3 are provided on the base 1 has been described, but the present invention is not limited thereto, and the protrusions 20 may be provided on the cover 11.

3. Third Exemplary Embodiment

Next, an electronic control device according to a third exemplary embodiment will be described with reference to FIG. 7.

Figure 7:
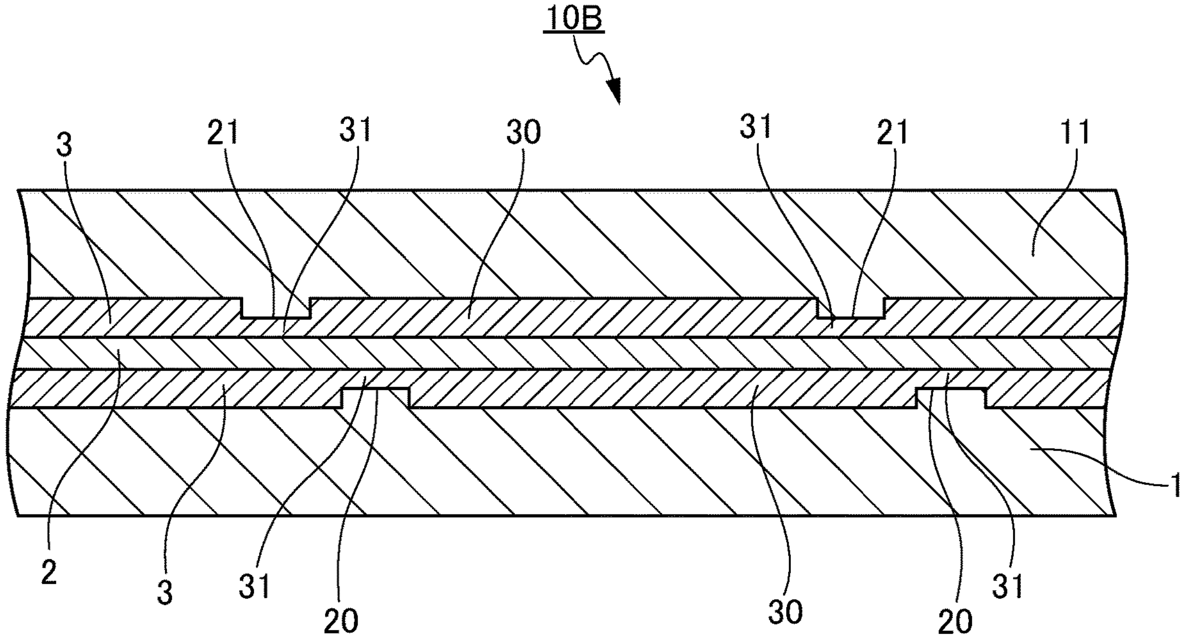
FIG. 7 is a cross-sectional view illustrating an electronic control device according to a third exemplary embodiment.

FIG. 7 is a cross-sectional view illustrating the electronic control device. Note that a part common to the electronic control device 10 according to the first exemplary embodiment and the electronic control device 10A according to the second exemplary embodiment is denoted by one reference numeral, and redundant description will be omitted.

As illustrated in FIG. 7, in an electronic control device 10B according to the third exemplary embodiment, a part of the substrate 2 is sandwiched between the base 1 and the cover 11. In addition, the shielding material 3 is filled not only between the base 1 and the substrate 2 but also between the cover 11 and the substrate 2. In addition, the shielding material 3 electrically connects the base 1 and the substrate 2, and electrically connects the cover 11 and the substrate 2.

A first protrusion 20 is formed at a portion of the base 1 where the shielding material 3 is provided, and similarly, a second protrusion 21 is provided at a portion of the cover 11 where the shielding material 3 is provided. The first protrusion 20 protrudes from the surface of the base 1 facing the substrate 2 toward the substrate 2. Furthermore, the second protrusion 21 protrudes from the surface of the cover 11 facing the substrate 2 toward the substrate 2.

As a result, the low compression region 30, and the high compression region 31 pressed by the first protrusion 20 and the second protrusion 21 are formed in the shielding material 3 filled between the base 1 and the substrate 2, and the shielding material 3 filled between the cover 11 and the substrate 2, respectively. That is, a low impedance region (high compression region 31) where the impedance locally decreases can be provided on both surfaces of the substrate 2. As a result, when electronic components 4 are mounted on both surfaces of the substrate 2, leakage of the electromagnetic radiation 5 emitted from both surfaces of the substrate 2 to the outside can be efficiently reduced.

Note that the positions of the low compression region 30 and the high compression region 31 are determined by the positions of the first protrusion 20 and the second protrusion 21. In addition, the first protrusion 20 and the second protrusion 21 are preferably provided at positions not facing each other with the substrate 2 interposed between the first protrusion 20 and the second protrusion 21. Furthermore, the protrusion heights of the first protrusion 20 and the second protrusion 21 from the base 1 or the cover 11 may be the same height or different heights. That is, the compressibility of the shielding material 3 by the first protrusion 20 and the compressibility of the shielding material 3 by the second protrusion 21 may be set to the same value, or may be set to different values.

Since other configurations are similar to those of the electronic control device 10 according to the first embodiment, the description thereof will be omitted. The electronic control device 10B having such a configuration can also obtain the same operation and effect as those of the electronic control device 10 according to the first exemplary embodiment described above.

4. Fourth Exemplary Embodiment

Next, an electronic control device according to a fourth exemplary embodiment will be described with reference to FIGS. 8 and 9.

Figure 8:
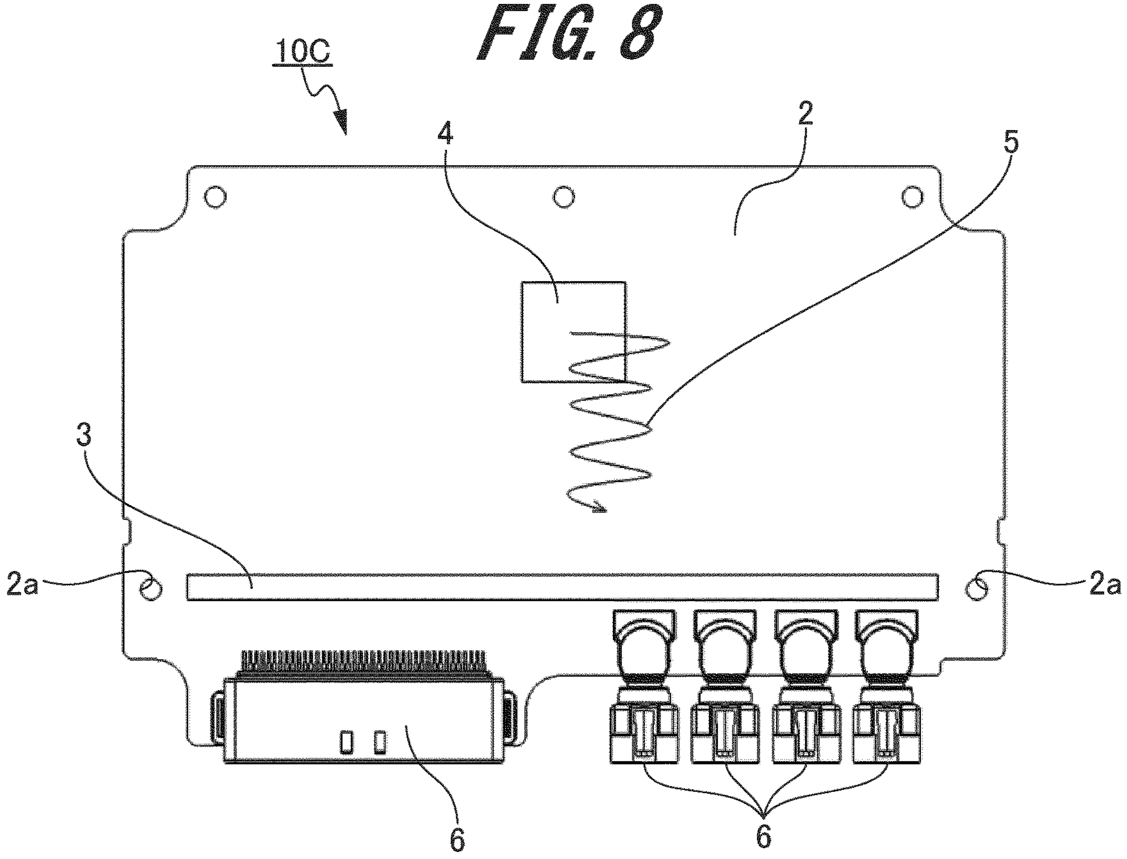
FIG. 8 is a plan view illustrating a substrate of an electronic control device according to a fourth exemplary embodiment.
Figure 9:
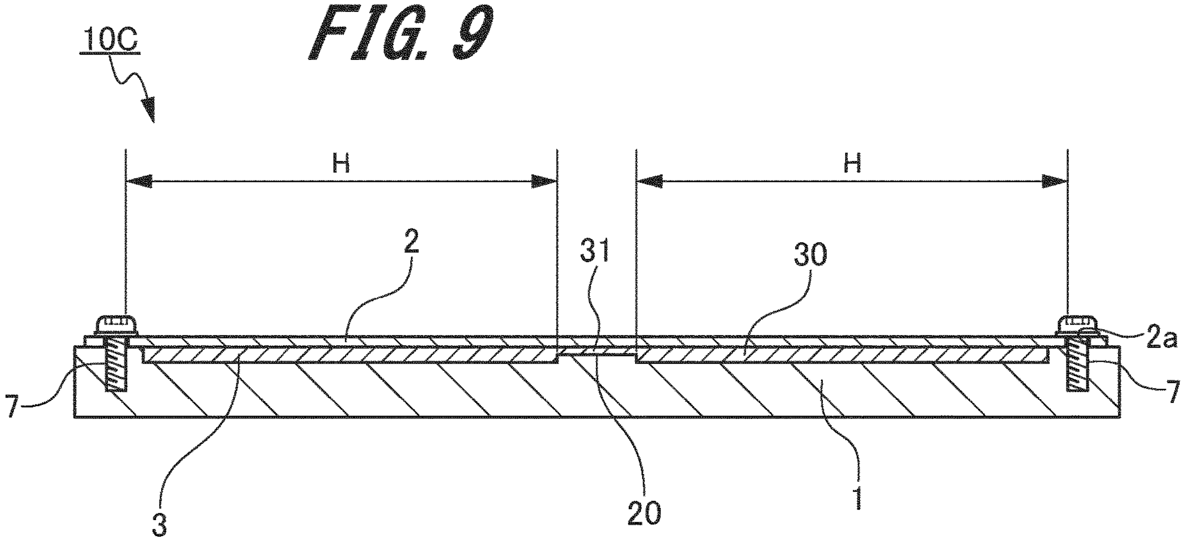
FIG. 9 is a cross-sectional view illustrating the electronic control device according to the fourth exemplary embodiment.

FIG. 8 is a plan view and FIG. 9 is a cross-sectional view illustrating a substrate of the electronic control device. Note that a part common to the electronic control device 10 according to the first exemplary embodiment is denoted by one reference numeral, and redundant description will be omitted.

As illustrated in FIG. 8, the electronic component 4 and the connector 6 are mounted on the substrate 2 of an electronic control device 10C according to the fourth exemplary embodiment. The connector 6 is provided on one side of the substrate 2. Screw holes 2*a* for fixing to the base 1 are formed in the substrate 2. The screw holes 2*a* are provided at four corners of substrate 2. As illustrated in FIG. 9, a fixing screw 7 is inserted into the screw hole 2*a* of the substrate 2. In addition, the substrate 2 is fixed to the end of the base 1 via the fixing screws 7. The substrate 2 and the base 1 are electrically connected by the fixing screws 7. Therefore, the impedance decreases at the portions where the fixing screws 7 are provided in the substrate 2 and the base 1. That is, the fixing screws 7 serve as contact portions that electrically connect the substrate 2 and the base 1.

Furthermore, the shielding material 3 is filled between the base 1 and the substrate 2. Referring back to FIG. 8, the shielding material 3 is disposed on one side of the substrate 2 on which the connector 6 is mounted. In addition, the shielding material 3 is disposed between the connector 6 and the electronic component 4 as an electromagnetic radiation source.

Moreover, the protrusion 20 protruding toward the substrate 2 is provided at a portion where the shielding material 3 is disposed in the base 1. In addition, a low impedance region (high compression region 31) where the impedance locally decreases is formed in the shielding material 3 by the protrusion 20. Furthermore, the protrusion 20 is formed between the two fixing screws 7 which are contact portions connecting the substrate 2 and the base 1.

In this case, the interval H between the protrusion 20 and the fixing screw 7 is set to be equal to or less than a half wavelength of the electromagnetic radiation 5 desired to be particularly suppressed. As a result, the electromagnetic radiation 5 leaking from the connector 6 can be reduced.

Since other configurations are similar to those of the electronic control device 10 according to the first embodiment, the description thereof will be omitted. The electronic control device 10C having such a configuration can also obtain the same operation and effect as those of the electronic control device 10 according to the first exemplary embodiment described above.

Note that, although the example in which the substrate 2, the base 1, and the fixing screws 7 are used for fixing has been described, the present invention is not limited thereto. As a method of fixing the substrate 2, for example, various fixing methods such as pressing and fixing via a rubber material, fixing by press fitting, and sandwiching and fixing by the base 1 and the cover 11 may be applied.

5. Fifth Exemplary Embodiment

Next, an electronic control device according to a fifth exemplary embodiment will be described with reference to FIGS. 10 to 11C.

Figure 10:
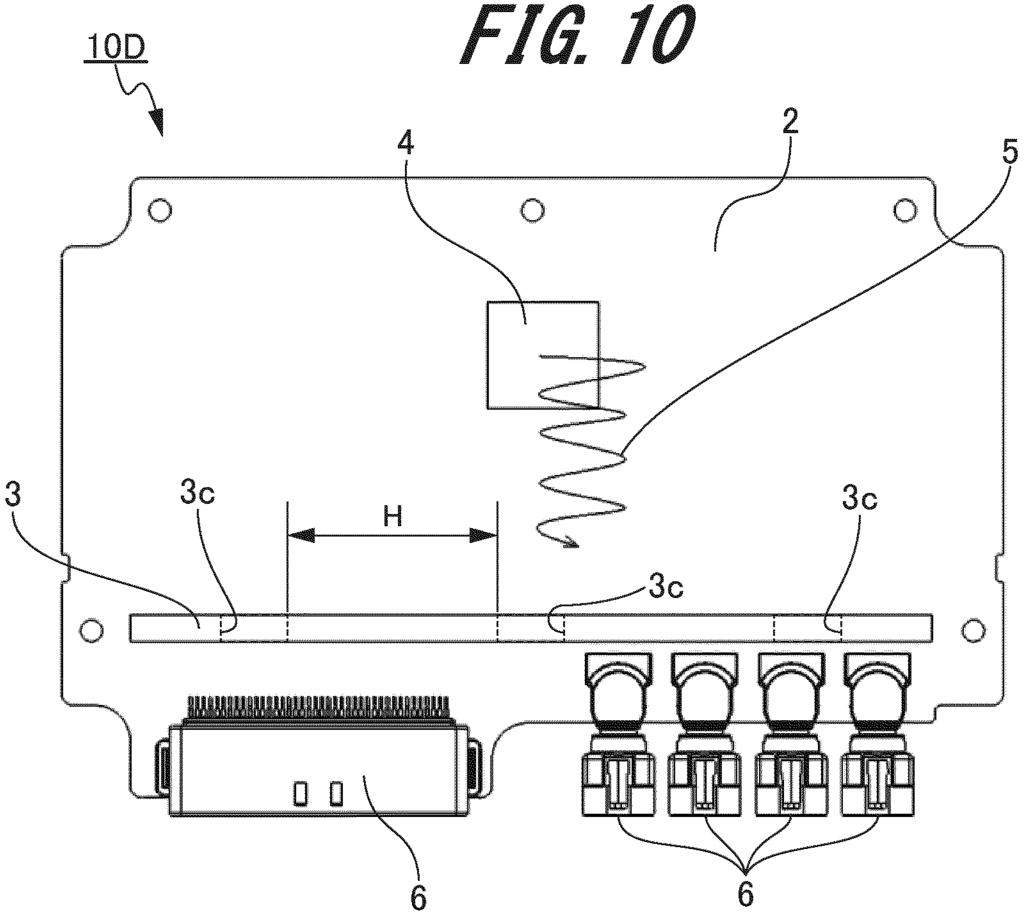
FIG. 10 is a plan view illustrating a substrate of an electronic control device according to a fifth exemplary embodiment.
Figure 11A:
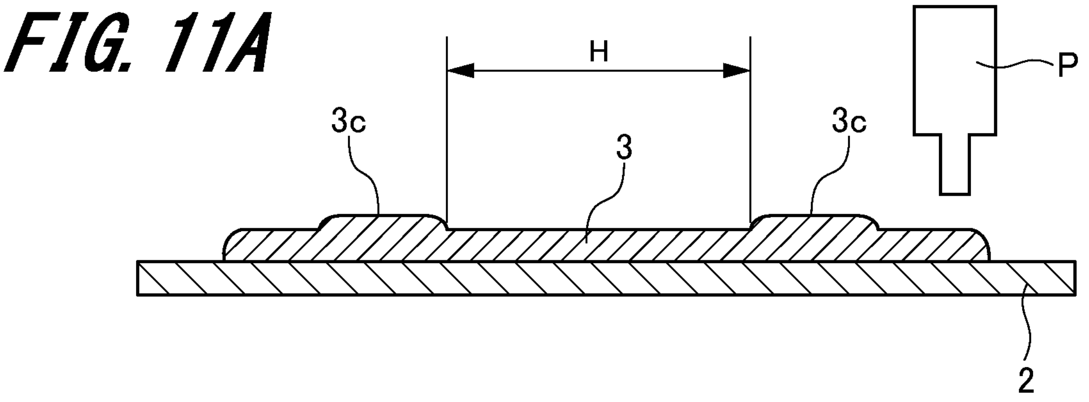
FIGS. 11A to 11C are explanatory diagrams illustrating a method of manufacturing the electronic control device according to the fifth exemplary embodiment.
Figure 11B:
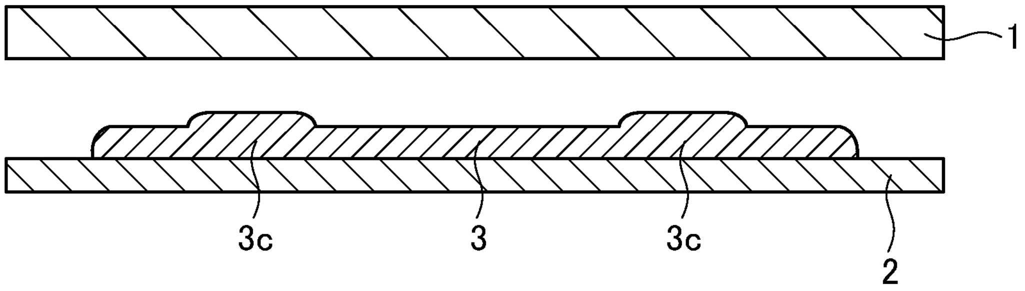
Figure 11C:
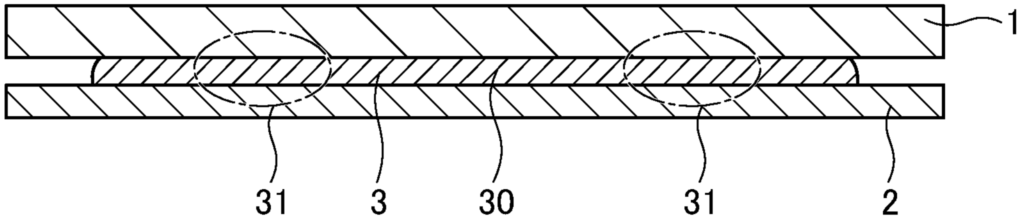

FIG. 10 is a plan view illustrating a substrate of the electronic control device, and FIGS. 11A to 11C are cross-sectional views illustrating a method of manufacturing the electronic control device. Note that a part common to the electronic control device 10 according to the first exemplary embodiment is denoted by one reference numeral, and redundant description will be omitted.

As illustrated in FIG. 10, the electronic component 4 and the connector 6 are mounted on the substrate 2 of an electronic control device 10D according to the fifth exemplary embodiment. The connector 6 is provided on one side of the substrate 2. The shielding material 3 is disposed on one side of the substrate 2 on which the connector 6 is mounted. The shielding material 3 is disposed between the connector 6 and the electronic component 4 as an electromagnetic radiation source. In addition, the shielding material 3 is interposed between the substrate 2 and the base 1 (see FIG. 11C). Note that CIPG is applied as the shielding material 3.

Next, a method of manufacturing the electronic control device 10D according to the fifth exemplary embodiment will be described with reference to FIGS. 11A to 11C.

First, as illustrated in FIG. 11A, the shielding material 3 is applied to one surface of the substrate 2 facing the base 1 by an application device P. As illustrated in FIG. 10, the shielding material 3 is applied between the electronic component 4 and the connector 6. Furthermore, as illustrated in FIG. 11A, the shielding material 3 applied to the substrate 2 has an area (hereinafter, referred to as high coating area) 3C in which the height of application is locally higher than other areas. A plurality of high coating areas 3C may be provided. In addition, as illustrated in FIGS. 10 and 11A, the interval H between the two adjacent high coating areas 3C in the plurality of high coating areas 3C is set to be less than or equal to a half of the wavelength of the electromagnetic radiation 5 desired to be particularly suppressed.

Next, when the shielding material 3 is cured, the substrate 2 and the base 1 are brought close to each other as illustrated in FIG. 11B. Note that the surface of the portion where the shielding material 3 is disposed in the base 1 according to the fifth exemplary embodiment is formed in a planar shape. In addition, as illustrated in FIG. 11C, the substrate 2 is fixed to the base 1. As a result, the shielding material 3 is interposed between the substrate 2 and the base 1. In this case, the interval between the substrate 2 and the base 1 when the substrate 2 and the base 1 are overlapped is uniformly set.

In this case, by providing the high coating area 3C in the shielding material 3, when the substrate 2 and the base 1 are overlapped, the density of the conductive fillers 3*b* (see FIGS. 3 and 4) in the high coating area 3C becomes higher than that in other areas. As a result, the high compression region 31 which is a region where the density of the conductive filler 3*b* is high, that is, the low impedance region, and the low compression region 30 which is a region where the density of the conductive filler 3*b* is low are formed in the shielding material 3. As described above, according to the electronic control device 10D according to the fifth exemplary embodiment, it is possible to locally provide the low impedance region (high compression region 31) in the shielding material 3 without providing the protrusion 20 in the base 1.

Since other configurations are similar to those of the electronic control device 10 according to the first embodiment, the description thereof will be omitted. The electronic control device 10D having such a configuration can also obtain the same operation and effect as those of the electronic control device 10 according to the first exemplary embodiment described above.

Note that, in the electronic control device 10D according to the fifth exemplary embodiment, an example in which the shielding material 3 is applied to the substrate 2 has been described, but the present invention is not limited thereto, and the shielding material 3 may be applied to the base 1. Furthermore, the shielding material 3 interposed between the base 1 and the cover 11 constituting the housing and the shielding material 3 interposed between the cover 11 and the substrate 2 may be provided with the high coating area 3C in which the height of application locally increases as in the above-described exemplary embodiment.

6. Sixth Exemplary Embodiment

Next, an electronic control device according to a sixth exemplary embodiment will be described with reference to FIGS. 12 and 13.

FIG. 12 is a perspective view and FIG. 13 is a cross-sectional view illustrating the electronic control device. Note that a part common to the electronic control device 10 according to the first exemplary embodiment is denoted by one reference numeral, and redundant description will be omitted.

As illustrated in FIG. 12, the base 1 and the cover 11 constituting the housing of an electronic control device 10E according to the sixth exemplary embodiment are fixed via the fixing screws 7. Note that a method of fixing the base 1 and the cover 11 is not limited to the fixing screws 7, and various other fixing methods such as crimping and engagement using an engagement claw can be applied.

Moreover, as illustrated in FIG. 13, the shielding material 3 is filled between the base 1 and the substrate 2. Similarly, the shielding material 3 is filled between the cover 11 and the substrate 2. In addition, the shielding material 3 electrically connects the base 1 and the substrate 2, and electrically connects the cover 11 and the substrate 2.

A first protrusion 20 is formed at a portion of the base 1 where the shielding material 3 is provided, and similarly, a second protrusion 21 is provided at a portion of the cover 11 where the shielding material 3 is provided. The first protrusion 20 protrudes from the surface of the base 1 facing the substrate 2 toward the substrate 2. Furthermore, the second protrusion 21 protrudes from the surface of the cover 11 facing the substrate 2 toward the substrate 2. In addition, the low compression region 30, and the high compression region 31 pressed by the first protrusion 20 and the second protrusion 21 are formed in the shielding material 3 filled between the base 1 and the substrate 2 and the shielding material 3 filled between the cover 11 and the substrate 2, respectively.

Furthermore, as illustrated in FIG. 13, a seal member 8 is interposed between the side surface portion 1*a* of the base 1 and the edge portion 11*a* of the cover 11 where the base 1 and the cover 11 overlap each other. The seal member 8 is disposed outward than the shielding material 3 provided on the base 1 and the cover 11. In addition, the seal member 8 prevents water, dust, and the like from entering the housing formed by the base 1 and the cover 11.

The conductive filler 3*b* included in the shielding material 3 may cause corrosion due to an external environment depending on a material. On the other hand, by providing the seal member 8 outward than the shielding material 3, the shielding material 3 can be prevented from being exposed to the external environment, and the conductive filler 3*b* can be prevented from corroding.

Since other configurations are similar to those of the electronic control device 10 according to the first embodiment, the description thereof will be omitted. The electronic control device 10E having such a configuration can also obtain the same operation and effect as those of the electronic control device 10 according to the first exemplary embodiment described above.

Note that the present invention is not limited to the embodiments described above and illustrated in the drawings, and various modifications can be made without departing from the gist of the invention described in the claims. Furthermore, a part of the configuration of a certain exemplary embodiment can be replaced with a configuration of another exemplary embodiment, and a configuration of another exemplary embodiment can be added to a configuration of a certain exemplary embodiment. Moreover, it is possible to add, delete, and replace other configurations for a part of a configuration of another exemplary embodiment.

Note that, in the present specification, words such as "parallel", "orthogonal", and the like are used, but these words do not strictly mean only "parallel" and "orthogonal", and may be in a state of "substantially parallel" or "substantially orthogonal" including "parallel" and "orthogonal" and in a range in which the function can be exhibited.

REFERENCE SIGNS LIST

1 Base (First housing)
1*a* Side surface portion
1*b* Opening portion
2 Substrate
2*a* Screw hole
3 Shielding material
3*a* Base material
3*b* Conductive filler
3C High coating area
4 Electronic component
5 Electromagnetic radiation
6 Connector
6*a* Mounting portion
7 Fixing screw
8 Seal member
10, 10A, 10B, 10C, 10D, 10E Electronic control device
11 Cover (Second housing)
11*a* Edge portion
20 Protrusion (First protrusion)
21 Second protrusion
30 Low compression region
31 High compression region (Low impedance region)
L1 Conductive path

The invention claimed is:

1. An electronic control device comprising:
a substrate on which an electronic component is mounted;
a connector is mounted on the substrate;
a housing that houses the substrate;
an opening portion is formed in the housing; and
a shielding material that is filled between the substrate and the housing, includes a base material and a conductive filler, and electrically connects the substrate and the housing, wherein
the shielding material comprises a low-impedance region which has an impedance lower than that of another region of the shielding material, and a density of the conductive filler in the low-impedance region is higher than that of the conductive filler in the another region of the shielding material, wherein the opening portion faces the connector and the shielding material.

2. The electronic control device according to claim 1, wherein
the housing has a protrusion that presses the shielding material, and
the low impedance region is a high compression region in which the shielding material is pressed by the protrusion.

3. The electronic control device according to claim 2, wherein
a plurality of the protrusions is provided in the housing, and
an interval between two adjacent protrusions in the plurality of protrusions is set to a half or less of a wavelength of electromagnetic radiation to be reduced.

4. The electronic control device according to claim 2, comprising
contact portions that are disposed at both ends of the housing and electrically connect the substrate and the housing, wherein
the protrusion is formed between the two contact portions.

5. The electronic control device according to claim 4, wherein
an interval between the contact portion and the protrusion is set to a half or less of a wavelength of electromagnetic radiation to be reduced.

6. The electronic control device according to claim 4, wherein
the contact portion is a fixing screw that fixes the substrate to the housing.

7. The electronic control device according to claim 1, wherein
the shielding material is provided between the substrate and the connector.

8. The electronic control device according to claim 1, wherein
the housing includes a first housing and a second housing overlapping the first housing,
the shielding material is filled also in a portion where the first housing and the second housing overlap, and electrically connects the first housing and the second housing, and
at least one of the first housing and the second housing is provided with a protrusion that presses the shielding material.

9. The electronic control device according to claim 8, wherein
a part of the substrate is sandwiched between the first housing and the second housing,
the shielding material is filled between the substrate and the first housing and between the substrate and the second housing,
the first housing has a first protrusion that presses the shielding material, and the second housing has a second protrusion that presses the shielding material.

10. The electronic control device according to claim 9, wherein the first protrusion and the second protrusion are disposed at positions not facing each other with the substrate interposed between the first protrusion and the second protrusion.

11. The electronic control device according to claim 1, wherein the shielding material is applied to the substrate or the housing, the shielding material applied to the substrate or the housing has a high coating area in which a height of application is locally higher than in other areas, and the high coating area is the low impedance region.

12. The electronic control device according to claim 1, wherein the shielding material is a cured-in-place gasket.

* * * * *